(12) United States Patent
Ostrowski et al.

(10) Patent No.: US 6,970,009 B1
(45) Date of Patent: Nov. 29, 2005

(54) SINGLE-TRANSISTOR TWO RESISTOR CIRCUIT WHICH TRANSLATE TEST SIGNALS TO SELECTABLE VOLTAGE LEVELS

(75) Inventors: Carl Larry Ostrowski, Pinckney, MI (US); Robert Howard Carlson, Aliso Viejo, CA (US)

(73) Assignee: Unisys Corporation, Blue Bell, PA (US)

( * ) Notice: Subject to any disclaimer, the term of this patent is extended or adjusted under 35 U.S.C. 154(b) by 79 days.

(21) Appl. No.: 10/759,917

(22) Filed: Jan. 16, 2004

(51) Int. Cl.$^7$ ............................................. G01R 31/26

(52) U.S. Cl. ..................... 324/765; 324/158.1
(58) Field of Search ................ 324/754–755, 324/763–765, 158.1, 72.5; 327/530, 538, 327/540–541, 543

(56) References Cited

U.S. PATENT DOCUMENTS 6,147,549 A * 11/2000 Ohno ......................... 327/541
6,373,260 B1 * 4/2002 Weller et al. ................ 324/627

* cited by examiner

Primary Examiner—Minh N. Tang
(74) Attorney, Agent, or Firm—Charles J. Fassbender; Mark T. Starr; Lise A. Rode

(57) ABSTRACT

A signal translator circuit, for use in sending test signals to an IC-chip in a chip testing system, includes first and second resistors, and a single transistor. The transistor has a current channel which is coupled in series with the first resistor between a source voltage terminal and an output terminal. The single transistor also has a control lead, for enabling and disabling the flow of current through the current channel, which receives an input test signal at voltage levels that are to be translated. The output terminal is coupled through the second resistor to a reference voltage terminal. The output terminal is also coupled to an input terminal of a socket which is structured to hold the IC-chip.

12 Claims, 11 Drawing Sheets

Eq. 1   ∼MAX POWER = (MAX CURRENT)$^2$(55 + R − ON + 121)

Eq. 2   ∼MAX CURRENT = $\dfrac{3.15}{55 + R - ON + 121}$

Eq. 3   ∼R − ON = 4.5Ω ± 50%

Eq. 4   ∼MAX CURRENT = $\dfrac{3.15}{55 + 2.25 + 121}$ = 17.6 ma

Eq. 5   ∼MAX POWER = (17.6 ma)$^2$ (55 + 2.25 + 121) = 55.6 mw

Eq. 6   ∼Compare: EDGE 692
                 MIN POWER PER CHIP = 1.5 WATTS
                 MAX POWER PER CHIP = 3.0 WATTS
                 TWO TRANSLATORS PER CHIP Eq. 7   ∼0.055 WATTS MAX VS 1.50 WATTS MAX Eq. 8   ∼0.000 WATTS MIN VS 0.75 WATTS MIN Eq. 9   ∼0.027 WATTS AVE VS 1.12 WATTS AVE

*Figure 6*

SINGLE-TRANSISTOR TWO RESISTOR CIRCUIT WHICH TRANSLATE TEST SIGNALS TO SELECTABLE VOLTAGE LEVELS

RELATED CASES

The present invention, as identified by the above title, is related to one other invention which is entitled "ELECTRO-MECHANICAL MODULE, FOR HOLDING IC-CHIPS IN A CHIP TESTING SYSTEM, THAT SYNCHRONIZES AND TRANSLATES TEST SIGNALS TO THE IC-CHIPS", having Ser. No. 10/759,910. Both inventions are described herein with a single Detailed Description. Patent applications on both inventions were filed concurrently in the U.S. Patent Office on Jan. 16, 2004.

BACKGROUND OF THE INVENTION

The present invention relates to systems for testing integrated circuit chips (IC-chips). More particularly, the present invention relates to the structure of signal translators in the above systems which send test signals to the IC-chips while they are tested.

In the prior art, one system for testing IC-chips is disclosed in U.S. Pat. No. 6,363,510 by J. Rhodes, et al. which is entitled "AN ELECTRONIC SYSTEM FOR TESTING CHIPS HAVING A SELECTABLE NUMBER OF PATTERN GENERATORS THAT CONCURRENTLY BROADCAST DIFFERENT BIT STREAMS TO SELECTABLE SETS OF CHIP DRIVER CIRCUITS". A block diagram of the above prior art system is shown in FIG. 1 of the '510 patent, and that figure is reproduced herein as FIG. 1.

Inspection of FIG. 1 shows that the chip testing system of patent '510 includes a plurality of chip holding modules, each of which is identified by reference numeral 10. Each chip holding module 10 is comprised of one printed circuit board 10b on which several sockets 10c are soldered, and each socket is structured to hold one IC-chip 10a that is to be tested.

The chip testing system of FIG. 1 also includes a separate chip driver module 11 for each chip holding module 10. In operation, the chip driver modules 11 send test signals to the IC-chips 10a on the chip holding modules 10, and the chip driver modules 11 also receive output signals from the IC-chips 10a as a response. All of these signals travel between the IC-chips 10a and the chip driver modules 11 via conductors 10e on the chip holding modules, connectors 10d on the chip holding modules, matching connectors (not shown) on the chip driver modules, and cables (shown as solid lines) which extend from one connector to another.

In order to be able to test many different types of IC-chips 10a with the system of FIG. 1, the test signals which are sent to the IC-chips need to have selectable voltage levels. For example, some types of IC-chips operate with test signals of "0" and "2.0" volts, whereas other types of IC-chips operate with test signals of "0" and "1.5" volts. Test signals with such different voltage levels are generated by including in each chip driver module 11, one signal translator circuit for each test signal which that chip driver module sends to an IC-chip 10a.

Now, a major drawback with the above chip testing system of patent '510 is that the total number of signal translators, connectors, and cables to those connectors which are required to generate and send the test signals is very large. This is evident from the following numerical example.

In a typical chip testing system which meets the industry standard called IEEE1149.1, each IC-chip 10a is tested by sending twenty test signals in parallel to the IC-chip and by receiving one signal in response. The twenty test signals that are sent to each IC-chip 10a are called TCK, TDI, TMS, HFCLK and vectors V1 thru V16. The one signal that is received from each IC-chip as a response is called TDO. Also, the number of sockets 10c in each chip holding module 10 is typically at least sixteen, and the number of chip holding modules 10 in one chip testing system is typically at least ten. FIG. 2 of the '510 patent shows a system with eleven chip holding modules.

Multiplying twenty times sixteen times ten yields a total of three thousand two hundred. Thus, at least that many signals need to be translated and carried by the connectors, with their cables, in the FIG. 1 system of patent '510. But all of those components add cost to the system and thereby make the system less competitive in the market place.

To address the above problem, each chip holding module 10 and each driver module 11 in the FIG. 1 system of patent '510 can be modified as shown herein in FIG. 1A. There, the modified chip holding module is indicated by reference numeral 10', and the modified chip driver module is indicated by reference number 11'.

In the modified chip driver module 11', the voltage levels of the signals TCK, TDI, TMS, HFCLK, and V1–V16 are translated from zero and VH1 to zero and VH2 by a single set of signal translator circuits 11x. The voltage level VH2 is determined by the magnitude of an analog V+input to each signal translator circuit 11x. One such signal translator in the prior art, which is actually used in the chip testing system of patent '510, is the Edge 692 Dual Pin Electronics Driver from Semtech Corporation of California.

All of the above voltage translated signals in FIG. 1A are carried by a single cable 10x from a single connector 11y on the modified driver module 11' to a single connector 10y on the modified chip holding module 10'. A single bus 10z on the modified chip holding module 10' carries the voltage translated signals from the connector 10y to all of the IC-chips 10a. The TDO signals from the IC-chips 10a are sent back to the modified driver module 11' over another cable with a connector on each end (not shown).

However, with the single bus structure of FIG. 1A, several other technical drawbacks arise. For example, suppose that one of the IC-chips 10a has a defect which shorts a particular input on the chip to ground. Then, if the shorted input receives a test signal from the bus 10z, the bussed test signal will be forced low on all of the IC-chips 10a which are held by the sockets 10c on the chip holding module 10'. Thus, all of the IC-chips 10a will fail their test even though only one IC-chip has a defect.

Accordingly, a primary object of the present invention is to provide a novel circuit for a signal translator which has certain advantages when used in large quantities in a chip testing system, and thereby enables the above problems to be overcome.

BRIEF SUMMARY OF THE INVENTION

The invention which is claimed herein is a signal translator circuit, which has a novel structure, for use in sending test signals to an IC-chip in a chip testing system. One embodiment of this signal translator circuit consists of first and second resistors, and a single transistor. The transistor has a current channel which is coupled in series with the first resistor between a source voltage terminal and an output terminal. In addition, the single transistor has a control lead, for enabling and disabling the flow of current thru the current channel, which receives an input test signal at voltage levels that are to be translated. Further, the output terminal is coupled by the second resistor to a reference voltage terminal, and the output terminal is also coupled to an input terminal of a socket which is structured to hold the IC-chip.

One particular advantage of the above signal translator circuit is that only three components are required to build it. These components are one transistor and two resistors. Thus, in systems which test large numbers of IC-chips concurrently, where each IC-chip is sent multiple voltage translated test signals in parallel, the economic benefit from having three component signal translators is significant.

A second advantage which is achieved with the above signal translator circuit is that the electrical power which is dissipated in the circuit is very small. In one particular embodiment which is described herein, the average power dissipation is only 0.027 watts. When this signal translator is used in a chip testing system which has ten chip holding modules, where each module has sixteen sockets and each socket receives twenty voltage translated test signals, the average power dissipation is only 86 watts. By comparison, if the prior art EDGE 692 signal translator is used, the average power dissipation is over 3,500 watts.

A third advantage which is achieved with the above signal translator circuit is that large variances can occur in the resistance through the current channel of the transistor without adversely effecting the translated output signal on the output terminal. In one embodiment, a variance of 50% in the resistance through the current channel of the transistor results in a variance of less than 3% in the translated output signal.

As one modification to the above embodiment, an inductor and a resistor are added in parallel between the current channel of the transistor and the second resistor. This modification achieves the additional advantage of preventing voltage overshoots and voltage undershoots on the output terminal.

BRIEF DESCRIPTION OF THE DRAWINGS

FIG. 6 shows on particular advantage which is achieved with the signal translator of FIG. 5.

DETAILED DESCRIPTION

Figure 2:
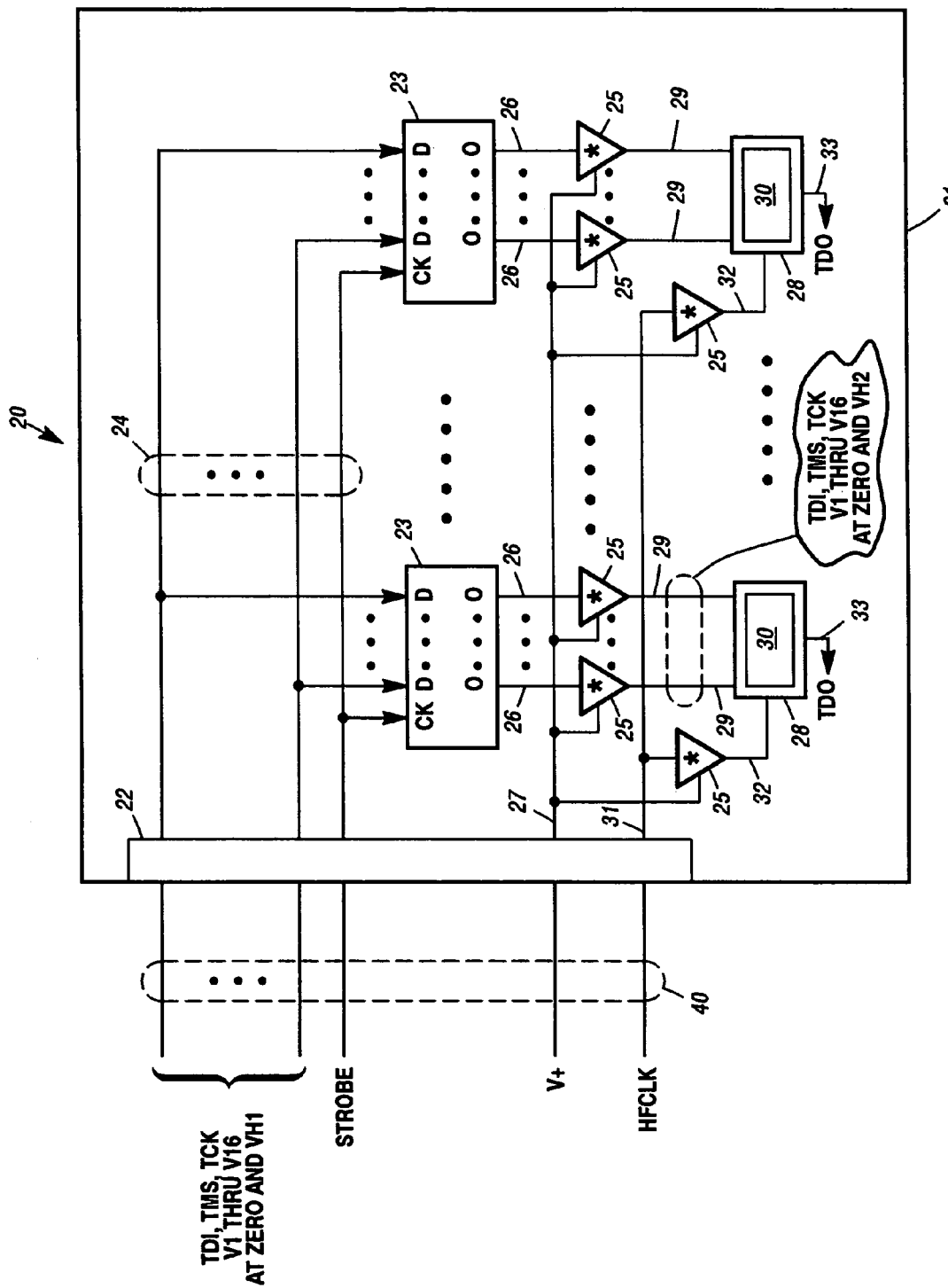
FIG. 2 shows a module for holding IC-chips which has a novel structure and which is one preferred embodiment of a first invention that is disclosed herein that overcomes the drawbacks of the system of FIG. 1 and the chip holding module of FIG. 1A.

In FIG. 2, reference numeral 20 identifies an electromechanical module for holding IC-chips in a chip testing system, which has a novel overall architecture. This module 20 is one preferred embodiment of a first invention that will be described. Also in FIG. 2, reference numeral 25 identifies several signal translator circuits in the module 20. Preferably, each signal translator circuit 25 has a novel internal structure which is described later in conjunction with FIG. 5, and is a second invention.

Inspection of FIG. 2 shows that the electromechanical module 20 is comprised of several components 21–33. Each of these components is described below in TABLE 1.

TABLE 1

| Component | Description |
|---|---|
| 21 | Component 21 is a circuit board which holds all of the other components 22–33. |
| 22 | Component 22 is a connector which - a) receives the signals TDI, TMS, TCK, V1–V16, V+, and HFCLK that were previously defined; and b) receives a new timing signal "STROBE". All of these signals are s nt to the conn ctor 22 at fixed voltage levels of zero and VE1, and they need to be translated to selectable voltage levels of zero and VH2 before they can be used to test IC-chips. |
| 23 | Component 23 is a register which is replicated multiple times on the circuit board 21. Each register 23 has one clock input CK, nineteen data inputs D, and nineteen data outputs 0. |
| 24 | Component 24 is a bus which carries the signals TDI, TMS, TCK, V1–V16, and STROBE from the connector 22 to all of the registers 23 in parallel. The signal STROBE is sent to the clock input CK on all of the registers 23, whereas the signals TDI, TMS, TCK, and V1–V16 are sent to the nineteen data inputs D on all of the r gisters 23. |
| 25 | Each component 25 is a signal translator circuit. For each IC-chip which can be tested concurrently on the module 20, separate signal translator circuits 25 are provided for the signals TDI, TMS, TCK, V1–V16, and HFCLK. |
| 26 | Each component 26 is a conductor which connects one particular output 0 of one particular register 23 to a signal input on one signal translator circuit 25. |
| 27 | Component 27 is a conductor which carries the V+ control voltage from the connector 22 to a control input on every signal translator circuit 25. |
| 28 | Each component 28 is a socket which is structured to hold one IC-chip that is to be tested. In the embodiment of FIG. 2, ach socket 28 is coupl d through the signal translator circuits 25 to a separate register 23. |
| 29 | Each component 29 is a conductor which connects the output of one particular signal translator circuit 25 to an input terminal on one particular socket 28. |
| 30 | Each component 30 is an IC-chip (which needs to be tested) that is held by one of the sockets 28. |
| 31 | Component 31 is a conductor which carries the signal HFCLK from the connector 22 to one signal translator circuit 25 for each socket 28. |
| 32 | Each component 32 is a conductor which carries the HFCLK signal from the output of one signal translator circuit to an input terminal on one socket 28. |

TABLE 1-continued

| Component | Description |
|---|---|
| 33 | Each component 33 is a conductor which carries the output signal TDO from the IC-chip 30 in one socket 28 to a second connector (not shown) on the circuit board 21. |

Figure 1:
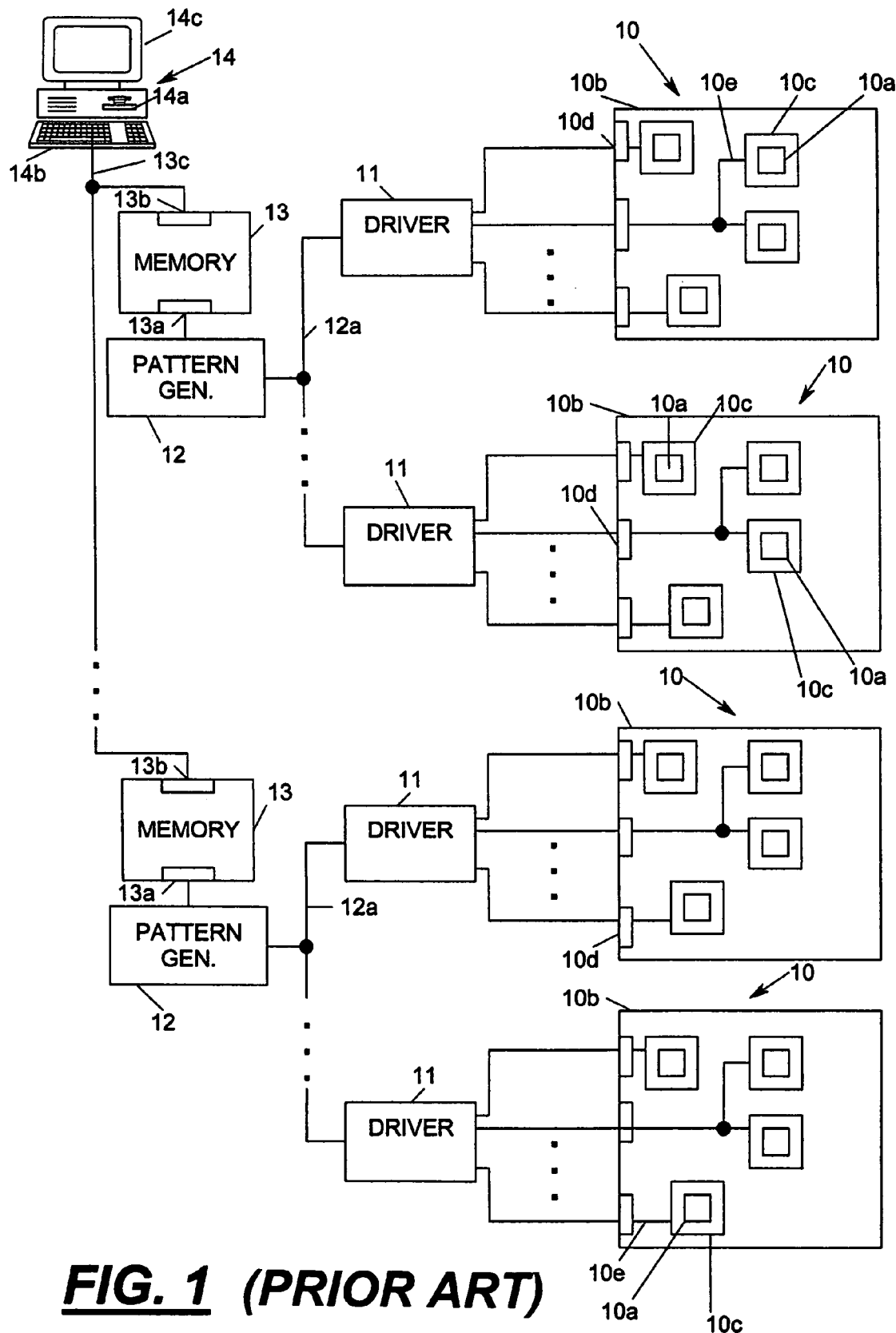
FIG. 1 shows a block diagram of a prior art system for testing IC-chips, which has certain technical drawbacks.

In operation, all of the signals TDI, TMS, TCK, V1–V16, STROBE, V+, and HFCLK are sent to the connector 22 over one cable 40 from another module (not shown) in the chip testing system. For example, if module 20 replaces the chip-holding module 10 in the prior art system of FIG. 1, then the driver module 11 in FIG. 1 will send the signals TDI, TMS, TCK, V1–V16, STROBE, V+, and HFCLK on the cable 40 in FIG. 2.

From the connector 22, the signals TDI, TMS, TCK, V1–V16 and STROBE are sent on the bus 24 to all of the registers 23. Each register 23 stores the signals TDI, TMS, TCK and V1–V16 in synchronization with the rising edge of zero to VH1 volts in the STROBE signal.

From the outputs O of the registers 23, the signals TDI, TMS, TCK, and V1–V16 are sent on the conductors 26 to the signal translator circuits 25. These signal translator circuits 25 generate signals on their outputs which replicate the signals on the conductors 26, but at voltage levels of zero and VH2.

From the signal translator circuits 25, the signals TKI, TMS, TCK and V1–V16 are sent on the conductors 29 to input terminal on the sockets 28. All of those signals then pass through the sockets 28 to the IC-chips 30 which the sockets hold.

In each IC-chip 30, one output signal TDO is generated in response to the signals TDO, TMS, TCK, and V1–V16 plus the HFCLK signal. The HFCLK signal is sent to each IC-chip 30 asynchronously with respect to the signals TDO, TRS, TCK, and V1–V16.

The output signals TDO from the IC-chip 30 are sent on the conductors 33 to a connector (not shown) on the circuit board 21, and from there the output signals TDO are sent over a cable to another module where they are compared against an expected result. For example, if module 20 replaces the chip holding module 10 in the prior art system of FIG. 1, then the TDO signals are compared with the expected results on the driver module 11.

One particular advantage which is achieved with the chip holding module 20 of FIG. 2 is that all of the signals TDI, TMS, TCK, V1–V16, STROBE, V+, and HFCLK can be sent to the bus 24 from an external source via a single cable 40 and a single connector 22 to the bus 24. This greatly reduces the total number of cables and connectors and their associated costs in systems which test large numbers of IC-chips concurrently, where each IC-chip that is tested receives multiple test signals in parallel.

A second advantage which is achieved with the chip holding module 20 of FIG. 2 results from each socket 28 having input terminals that are connected to the outputs of a respective set of signal translators 25. Due to that structure, a defective IC-chip 30 in any one socket 28 will not adversely effect the testing of another chip in any other socket.

Figure 3A:
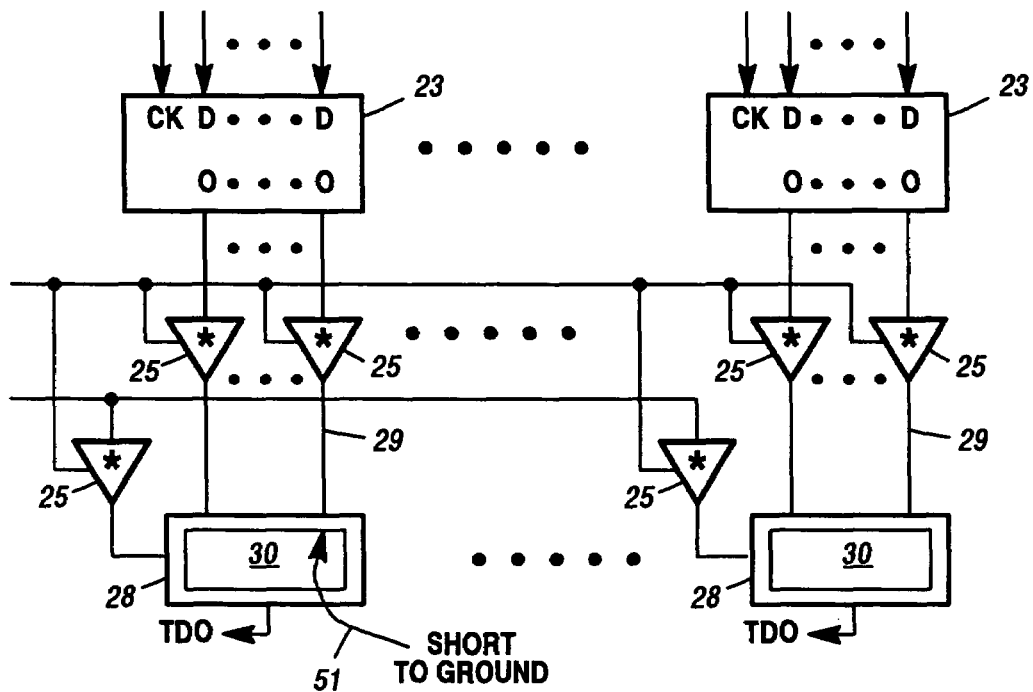
FIG. 3A shows one particular advantage which is achieved with the chip holding module of FIG. 2.

For example, FIG. 3A shows the above structure from module 20 under the condition where the left most IC-chip 30 has a particular type of defects which shorts one of its input terminals to zero volts (or ground). This is indicated by reference numeral 51. When that condition occurs, the zero volts on the shorted input terminal of the defective IC-chip will not be propagated to any input terminal of any other IC-chip in the sockets 28.

Figure 1A:
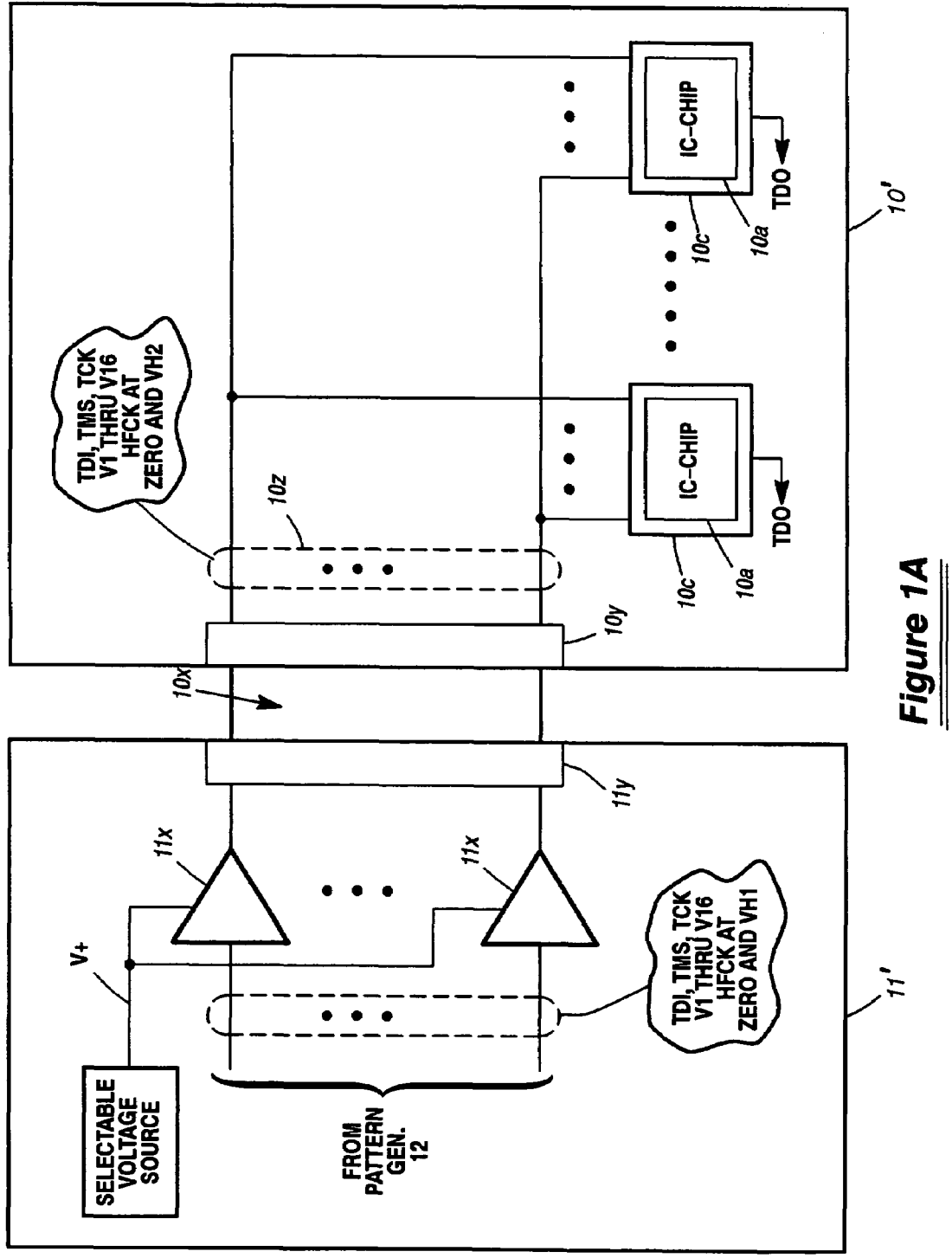
FIG. 1A shows a modification which can be made to a chip driver module and a chip holding module in the prior art system of FIG. 1 which avoids the technical drawbacks of that system, but which introduces different drawbacks.
Figure 3B:
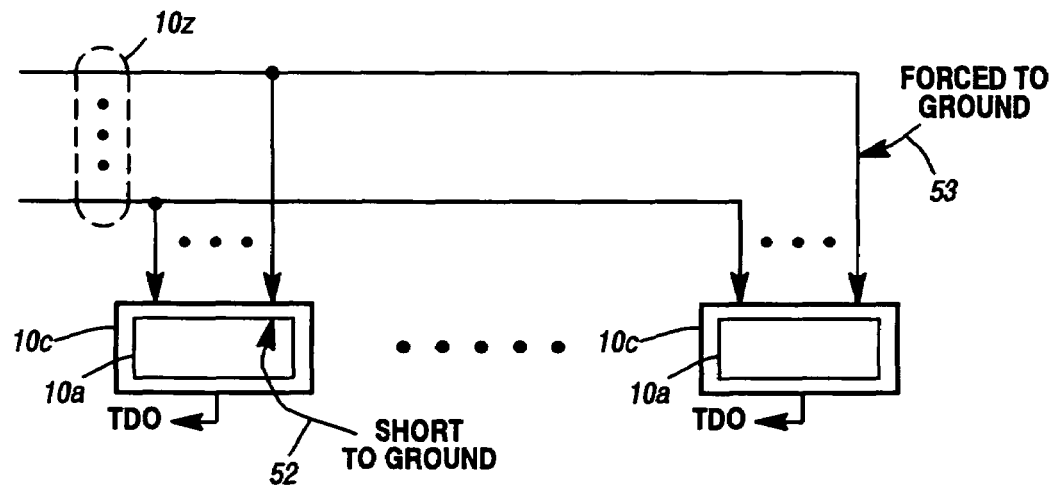
FIG. 3B shows that the chip holding module of FIG. 1A does not achieve the advantage that is illustrated in FIG. 3A.

By comparison, FIG. 3B shows the sockets 10c and the bus 10z from FIG. 1A under the condition where the left most IC-chip 10a has a defect which shorts one of its input terminals to ground. This indicated by reference numeral 52. When that condition occurs, the zero volts on the shorted input terminal of the defective IC-chip is propagated on the bus 10z to the same input terminal of every other IC-chip in the sockets 10c. This is indicated by reference numeral 53.

A third advantage which is achieved with the chip holding module 20 of FIG. 2 results from the registers 23 being coupled between the bus 24 and signal translators 25. This advantage is illustrated in FIGS. 4A and 4B.

Figure 4A:
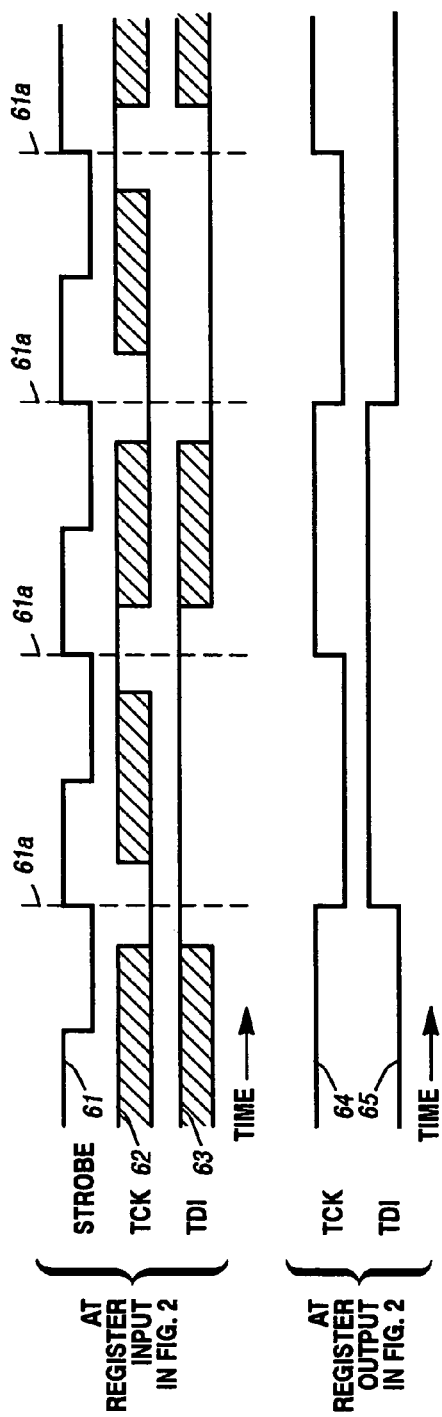
FIG. 4A shows another advantage which is achieved with the chip holding module of FIG. 2.
Figure 4A:
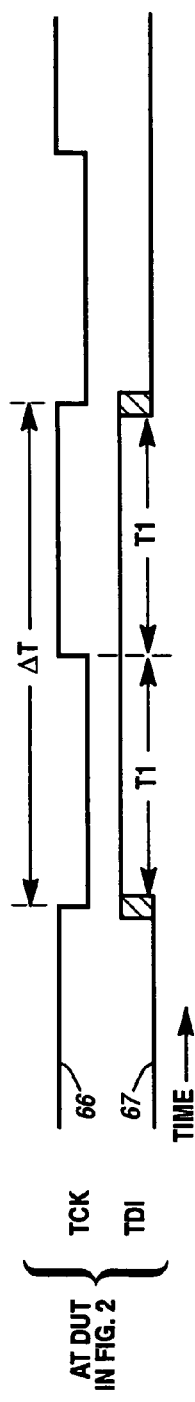
Figure 4B:
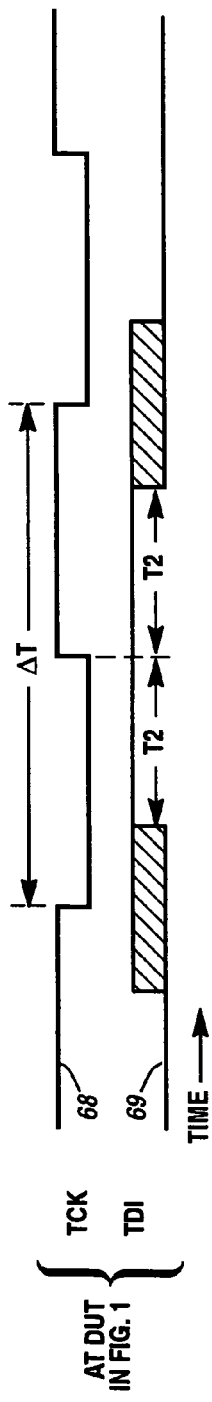
FIG. 4B shows that the chip holding module of FIG. 1A does not achieve the advantage that is illustrated in FIG. 4A.

In FIG. 4A, three voltage waveforms 61, 62 and 63 respectively show the signals STROBE, TCK, and TDI on the bus 24. In those waveforms, the hatched regions indicate when the signals TCK and TDI can change state relative to the STROBE signals.

Also in FIG. 4A, two voltage waveforms 64 and 65 respectively show the signals TCK and TDI as they occur on the outputs of the registers 23. These signals have no skew relative to each other because they are both loaded into the registers 23 in synchronization with each low-to-high transition 61a of the STROBE signal 61.

Further in FIG. 4A, two other voltage waveforms 66 and 67 respectively show the signals TCK and TDI at the input terminals of an IC-chip 30 in module 20. A small amount of skew occurs between the signals 66 and 67 due to variations in propagation delay on the conductors 26, through the signal translators 25, on the conductors. 29, and through the sockets 28.

By comparison, in FIG. 4B, two voltage waveforms 68 and 69 respectively show the signals TCK and TDI at the input terminals of the IC-chips 10a in module 10' of FIG. 1A. In these waveforms, the hatched region indicate when the signals change state relative to the TCK signal.

To make a fair comparison between the voltage waveforms of FIG. 4B and FIG. 4A, the hatched regions of the waveforms in FIG. 4B have the same time duration as the hatched regions of the waveforms in FIG. 4A. This means that waveforms in FIG. 1A are generated and propagated on the bus 10z with the same degree of precision that the waveforms in FIG. 2 are generated and propagated on the bus 24.

Inspection of FIG. 4A shows that the TDI waveform 67 is stable for a time interval T1 before and after each low-to-high transition in the TCK waveform 66. By comparison, inspection of FIG. 4B shows that the TDI waveform 69 is stable for a smaller time interval T2 before and after each low-to-high transition in the TCK wave form 68.

As the frequency of the TCK signal is increased, the period ΔT of that signal will decrease from that which is shown in FIGS. 4A and 4B. But, as the frequency of the TCK signal is increased, the time duration of the hatched regions which are shown in FIGS. 4A and 4B will stay the same. Thus, as the frequency of the TCK signal is increased, the time intervals T1 and T2 which are shown in FIGS. 4A and 4B will decrease.

But the time intervals T1 and T2 must have a certain minimum duration in order for the TCK and TDI signals to be operable with the IC-chips that they are testing. Therefore, the maximum frequency at which the IC-chips can be tested with the waveforms 66 and 67 of FIG. 4A is larger than the maximum frequency at which the IC-chips can be tested with the waveforms 68 and 69 of FIG. 4B.

Note that in FIGS. 4A and 4B, the signals TMS and V1–V16 are not shown. However, the voltage waveform for each of those signals is the same as the illustrated waveform for the TDI signal. Thus, everything that is said above with respect to the signal TDI also applies to each of the signals TMS and V1–V16.

All three of the above described advantages are obtained with module 20 of FIG. 2 without requiring the signal translators 25 to have any one particular internal structure. For example, these advantages are obtained even when each signal translator 25 is the prior art Edge 692 translator which is previously identified in the Background of the Invention.

Figure 5:
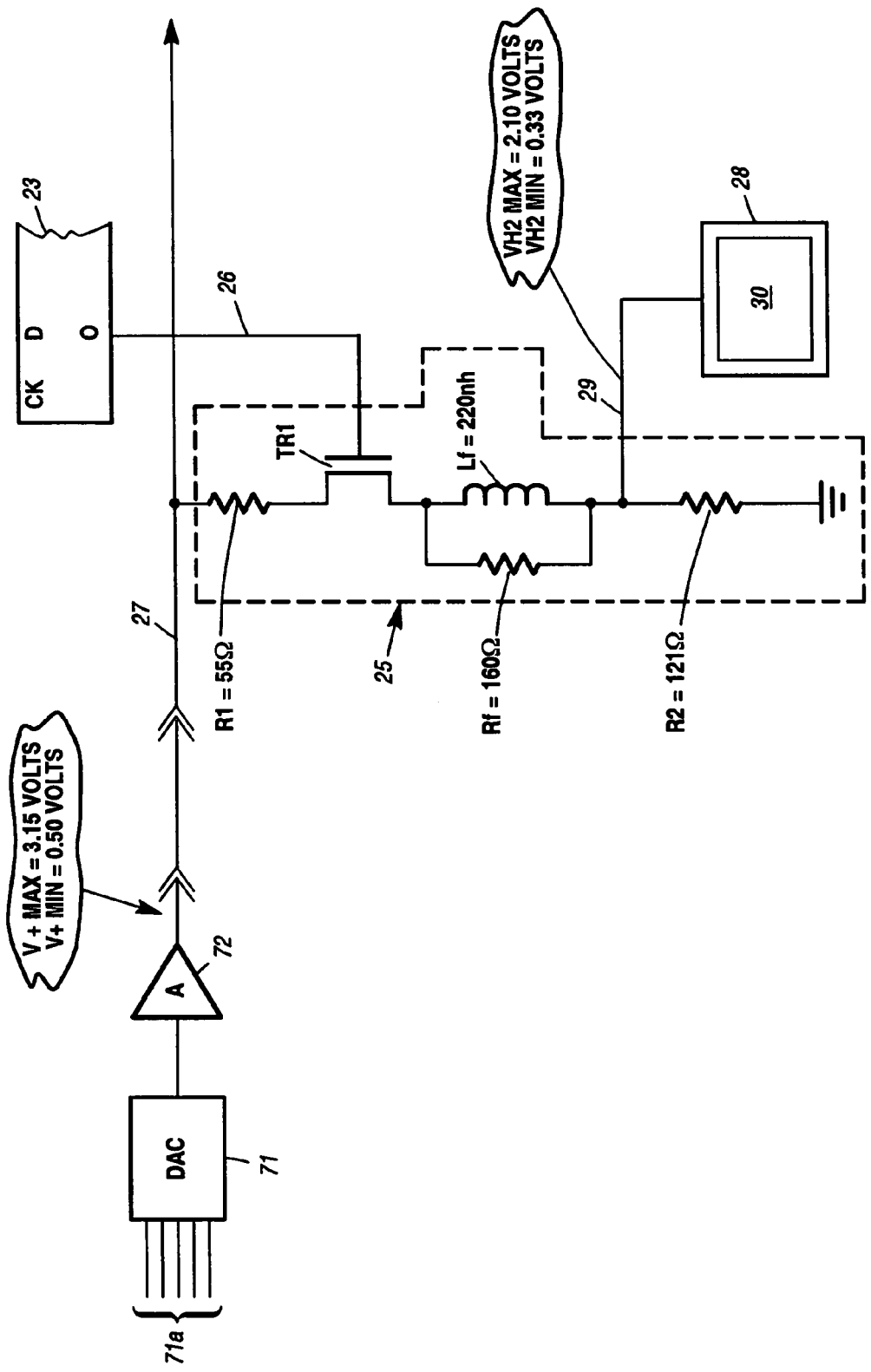
FIG. 5 shows a signal translator, for use in the chip holding module of FIG. 2, which has a novel structure and which is a preferred embodiment of a second invention that is disclosed herein.

However, in FIG. 2, each signal translator is represented by a triangle with an internal asterisk, and the asterisk indicates that each signal translator preferably has a novel structure that is shown in FIG. 5. By comparison, in FIG. 1A, each prior art signal translator 11x is represented by just a triangle.

Inspection of FIG. 5 shows that the signal translator 25 includes components R1, TR1, R2, Lf, and Rf. Each of these components is described below in TABLE 2.

TABLE 2

| Component | Description |
| --- | --- |
| R1 | Component R1 is a resistor. In the FIG. 5 embodiment, the resistor R1 is fifty ohms. |
| TR1 | Component TR1 is an N-channel field effect transistor. |
| Rf | Component Rf is a resistor. In the FIG. 5 embodiment, the resistor Rf is one-hundred-sixty ohms. |
| Lf | Component Lf is an inductor. In the FIG. 5 embodiment, the inductor Lf is two-hundred-twenty nano-henrys. |
| R2 | Component R2 is a resistor. In the FIG. 5 embodiment, the resistor R2 is one-hundred-twenty-one ohms. |

In operation, the resistor R1 receives a selectable voltage V+ on conductor 27 from a voltage source. FIG. 5 shows this voltage source as being comprised of a digital-to-analog converter 71 which is followed by a unity gain analog amplifier 72.

The magnitude of the V+ voltage from amplifier 72 is selected by digital signals on the input terminals 71a of the digital-to-analog converter 71. In FIG. 5, the V+ voltage from amplifier 72 ranges from 0.50 volts to 3.15 volts, as one example.

Transistor TR1 has a gate which is connected by conductor 26 to the output O of one of the registers 23. When the output voltage from register 23 is high, transistor TR1 turns ON. When the output voltage from register 23 is low, transistor TR1 turns OFF.

In the ON state, transistor TR1 provides a conductive path through its current channel. Consequently, current flows from conductor 27 to ground through resistor R1, transistor TR1, resistor Rf and inductor Lf in parallel, and resistor R2. By comparison, in the OFF state, the above current stops flowing.

When the above current is flowing, that current has a steady state magnitude of V+ divided by the total resistance through resistor R1, resistor R2, and the current channel of transistor TR1. That current through resistor R2 produces the output voltage on conductor 29.

One practical value of the resistance through the current channel of transistor TR1, when that transistor is turned ON, is 4.5 ohms. With that "ON resistance", the high output voltage on conductor 29 in FIG. 5 ranges from 0.33 volts to 2.10 volts as the V+ voltage is varied from 0.50 volts to 3.15 volts. The low output voltage on conductor 29 is always ground (or zero volts).

One advantage which is obtained with the signal translator 25 of FIG. 5 is that the amount of electrical power which the signal translator dissipates is very small. This will now be explained with reference to equations 1–9 in FIG. 6.

Equation 1 says that the maximum steady state power which is dissipated by the signal translator 25 of FIG. 5, is equal to the square of the maximum steady state current through transistor TR1 times each resistance which that current passes through. Next, equation 2 gives an expression for the maximum steady state current through transistor TR1. In that expression, the term of 3.15 is the maximum voltage that occurs on conductor 27.

Next, equation 3 says that the ON-resistance through the current channel of transistor TR1 has an average value of 4.5 ohms which can vary from one transistor to another by up to 50%. Thus the minimum ON-resistance through transistor TR1 is only 2.25 ohms.

Substituting 2.25 ohms for R-ON in equation 2 yields equation 4. There, the maximum current through transistor TR1 is calculated to be 17.6 milliamps.

Next, equation 5 is obtained by substituting 17.6 milliamps for MAX CURRENT in equation 1, and substituting 2.25 ohms for R—ON in equation 1. With equation 5, the maximum power dissipation of the FIG. 5 signal translator is calculated to be 55.6 milliwatts.

By comparison, page 10 of the data sheet for the prior art EDGE 692 signal translator (which was previously identified by reference numeral 11x in FIG. 1A) shows the maximum power dissipation per chip is 3.0 watts and the minimum power dissipation per chip is 1.5 watts. One chip consists of two signal translators. This data is restated in FIG. 6 by equation 6.

Equation 7 of FIG. 6 compares the maximum power dissipation in the signal translator 25 of FIG. 5 to the maximum power dissipation in one EDGE 692 signal translator. The comparison is 0.055 watts versus 1.5 watts.

Equation 8 of FIG. 6 compares the minimum power dissipation in the signal translator 25 of FIG. 5 to the minimum power dissipation in one EDGE 692 signal translator. That comparison is 0.00 watts to 0.75 watts.

Equation 9 of FIG. 6 compares the average power dissipation in the signal translator 25 of FIG. 5 to the average power dissipation in one EDGE 692 signal translator. This comparison is made by assuming that when an IC-chip is tested, the maximum power dissipations in the signal translators occur half of the time, and the minimum power dissipations in the signal translators occur half of the time. Equation 9 shows that the average power dissipation in the signal translator 25 of FIG. 5 is smaller than the average power dissipation in one EDGE 692 signal translator by more than a factor of 40.

To appreciate the significance of this power reduction, consider the chip testing system which has ten of the chip holding modules 20 of FIG. 2, where each module 20 has sixteen sockets 28, and where each socket receives the signals TCK, TDI, TMS, V1–V16, and HFCLK from a separate set of twenty signal translators. Then, in the case where the signal translators 25 of FIG. 5 are used, the total average power dissipation is (16)×(10)×(20)×(0.27) watts or 86 watts. But in the case where the EDGE 692 signal translator is used, the total average power dissipation is (16)×(10)×(20)×(1.12) watts or 3,584 watts!

A second advantage which is obtained with the signal translator 25 of FIG. 5 is that no voltage overshoot occurs in the output signal on conductor 29 when that signal switches from a low state to a high state. Likewise, no voltage undershoot occurs in the output signal on conductor 29 when that signal switches from a high state to a low state.

Figure 7A:
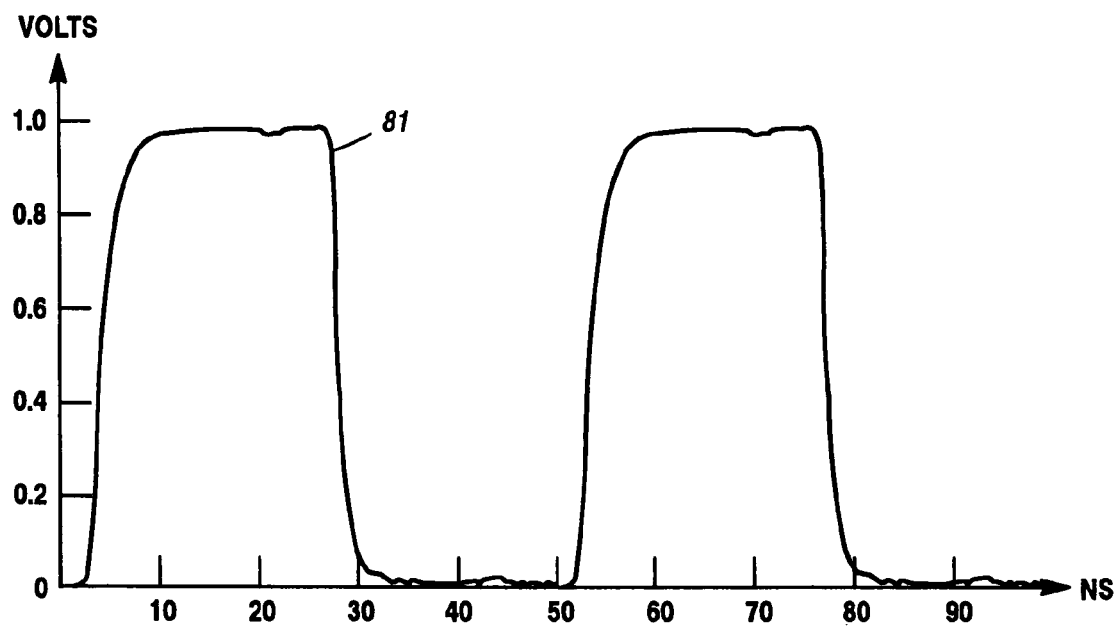
FIG. 7A shows another advantage which is achieved with the signal translator of FIG. 5.

The above advantage is shown in FIG. 7A. There, the output signal on conductor 29 is the voltage waveform 81. To obtain the voltage waveform 81, the signal translator 25 of FIG. 5 was built and tested, and the voltage waveform on conductor 29 was obtained with an oscilloscope.

No voltage overshoot and no voltage undershoot occurs in the voltage waveform 81 because in the signal translator 25 of FIG. 5, the resistor Rf and the indictor Lf operate as a low pass filter. That filter prevents high frequency voltage spikes from occurring on the output conductor 29.

A third advantage which is obtained with the signal translator 25 of FIG. 5, is that it consists of only the five components R1, TR1, Rf, Lf, and R2. This is important in reducing costs in chip testing systems which use the signal translators in large quantities.

One preferred embodiment of an electromechanical module for holding IC-chips in a chip testing system, as well as one preferred embodiment of a signal translator for use in the above module, have now been described in detail. In addition however, the following modifications can be made to those details without departing from the nature and spirit of the invention.

As one modification, the total number of components in each signal translator 25 can be reduced from five to just three by eliminating the resistor Rf and the inductor Lf. With this modification, resistor R2 and conductor 29 are connected directly to transistor TR1.

Figure 7B:
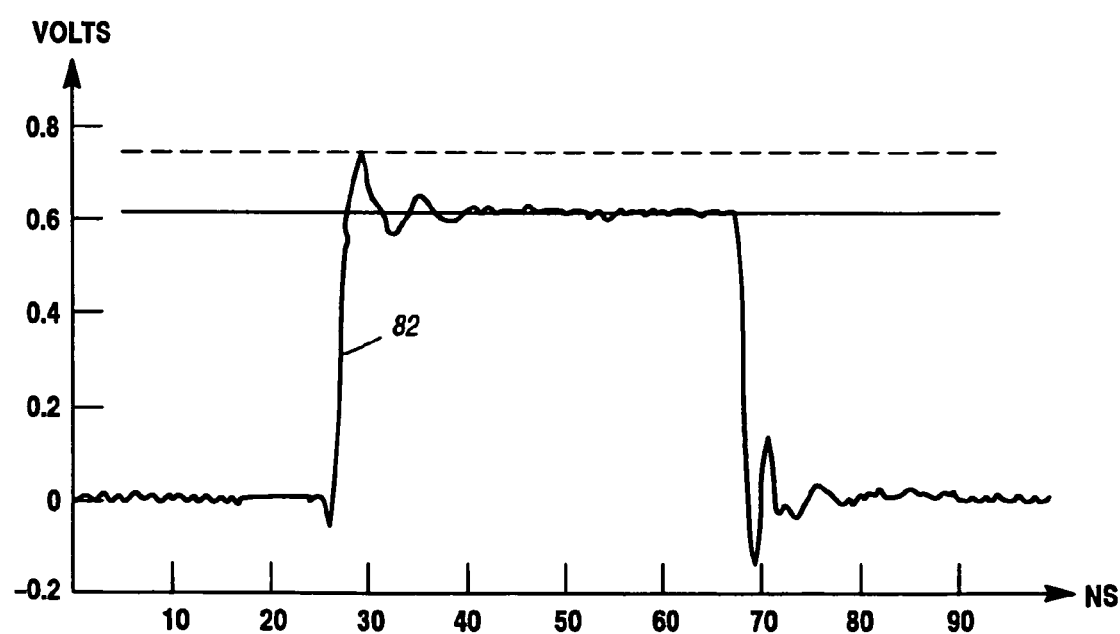
FIG. 7B shows how one particular modification to the signal translator of FIG. 5 affects the advantage that is illustrated in FIG. 7A.

When the above modification is made, the signal on conductor 29 has voltage overshoots and voltage undershoots as shown by waveform 82 in FIG. 7B. However, if the IC-chips which are being tested can tolerate those voltage overshoots and undershoots, the resistor Rf and inductor Lf can be eliminated from each signal translator to reduce the cost of the chip testing system.

As another modification, the order of the components R1 and TR1 in the signal translator 25 in FIG. 5 can be reversed. With this modification, transistor TR1 is connected directly to conductor 27, and resistor R1 is connected between transistor TR1 and the parallel combination of resistor Rf and inductor LF.

Also, this re-ordering of the components R1 and TR1 can be made together with the previously described modification in which the components Rf and Lf are eliminated. In that case, transistor TR1 is connected directly to conductor 27, and resistor R1 is connected between transistor TR1 and resistor R2.

Figure 8:
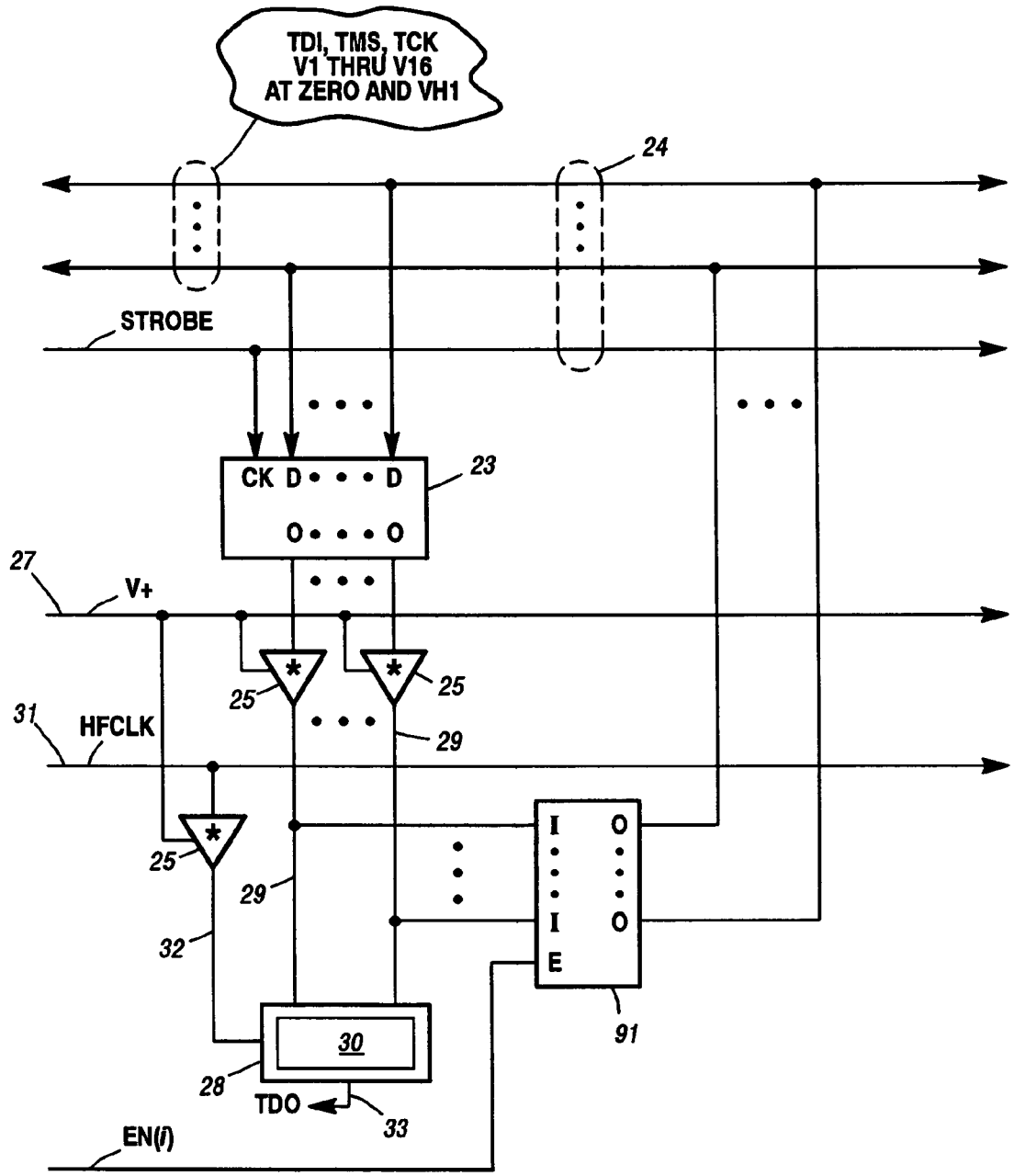
FIG. 8 shows a modification that can be made to the chip holding module of FIG. 2.

As still another modification, digital multiplexors can be added to module 20 of FIG. 2 which selectively couple the signals TDI, TRS, TCK, and V1–V16 from each socket 28 back to the bus 24. One such multiplier 91 is shown in FIG. 8. The multiplexors 91 in FIG. 8 is repeated for each socket 28 in module 20 of FIG. 2.

Multiplexor 91 has separate inputs "I" and separate outputs "O" for each of the signals TDI, TMS, TCK, and V1–V16. Multiplexor 91 also has one enable input E. All of the signals on the inputs "I" are regenerated on the outputs "O" when the enable input E receives a control signal EN(i) is high. Otherwise, when the control signal EN(i) is low, the outputs "O" are an open circuit.

With the above modification, the operation of each register 23 and the operation of each set of signal translators 25 with that register can be self tested by an external source. This external source can, for example, be the driver module 11 in the chip testing system in FIG. 1. The self test is performed by the following sequence.

To begin, the signals TDI, TCK, TMS, and V1–V16 are sent on the bus 24 by the external source. Next the external source generates the STROBE signal with a low-to-high voltage transition which causes the signals TDI, TCK, TMS, and V1–V16 to be loaded into all of the registers 23. Then the external source sequentially generates one separate control signal EN(i) for each socket 28. While each control signal is in a high voltage state, the external source checks the signals that are fed back to the bus 24 by the digital multiplexor 91.

Figure 9:
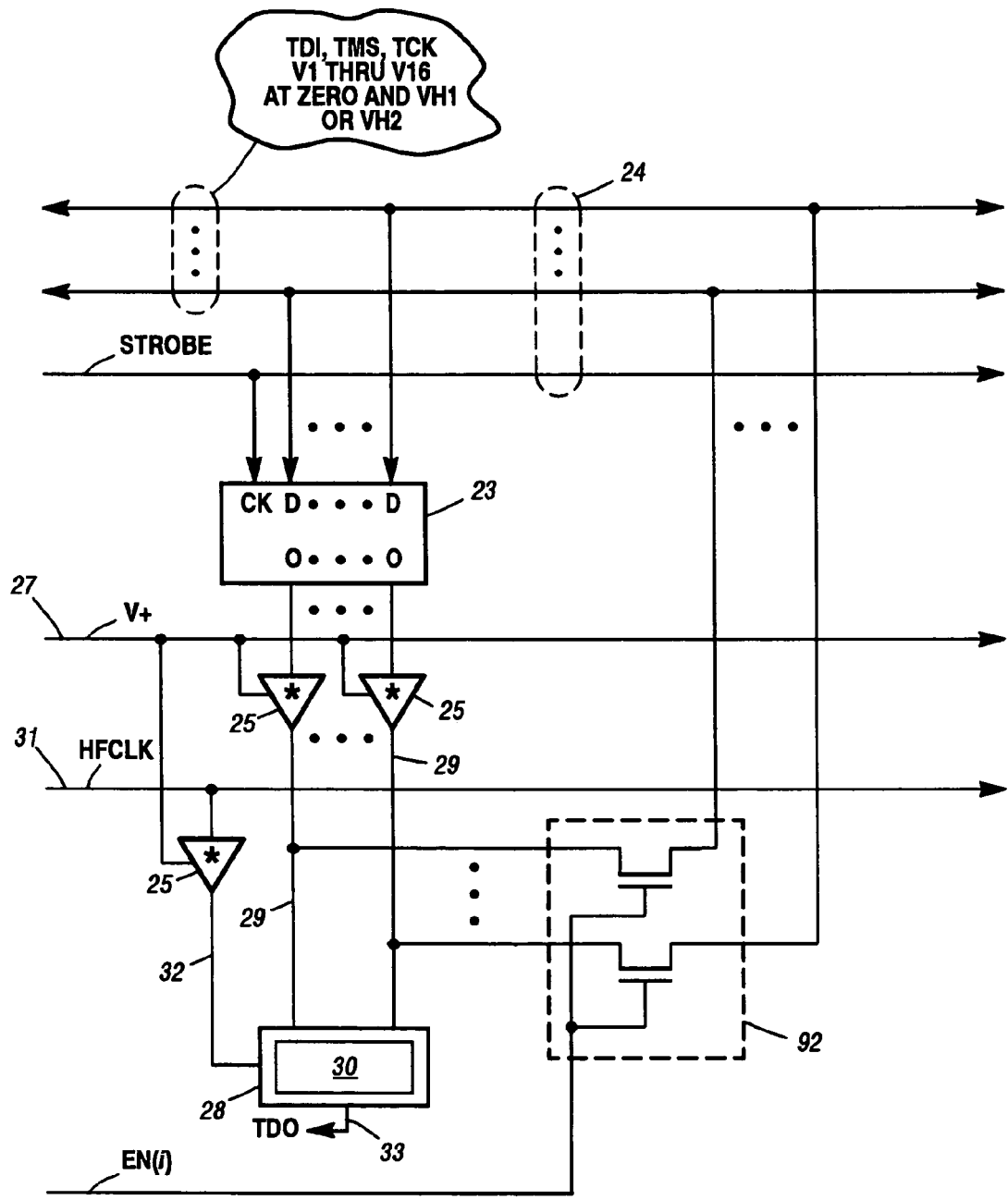
FIG. 9 shows another modification that can be made to the chip holding module of FIG. 2.

As yet another modification, analog multiplexors can be added to module 20 of FIG. 2 which selectively couple the signals TDI, TRS, TCK, and V1–V16 from each socket 28 back to the bus 24. One such multiplexor 92 is shown in FIG. 9. The multiplexor 92 in FIG. 9 is repeated for each socket 28 in module 20 of FIG. 2.

Multiplexor 92 includes separate N-channel field effect transistors for each of the signals TDI, TMX, TCK, and V1–V16. Each transistor has a gate which receives the externally generated control signal EN(i).

With the multiplexor 92, the analog voltage levels of the signals TDI, TMS, TCK, and V1–V16 from the signal translators 25 can be checked. To do that, the same test sequence is performed that was described above in conjunction with FIG. 8. But, while each control signal EN(i) is high, the actual output voltage from the signal translators 25 are checked on the bus 24.

As still another modification, a separate register 23 need not be provided for each socket 28 in module 20 of FIG. 2. Instead, one register 23 can be shared by two or more sockets 28. This modification is shown in FIG. 10.

Figure 10:
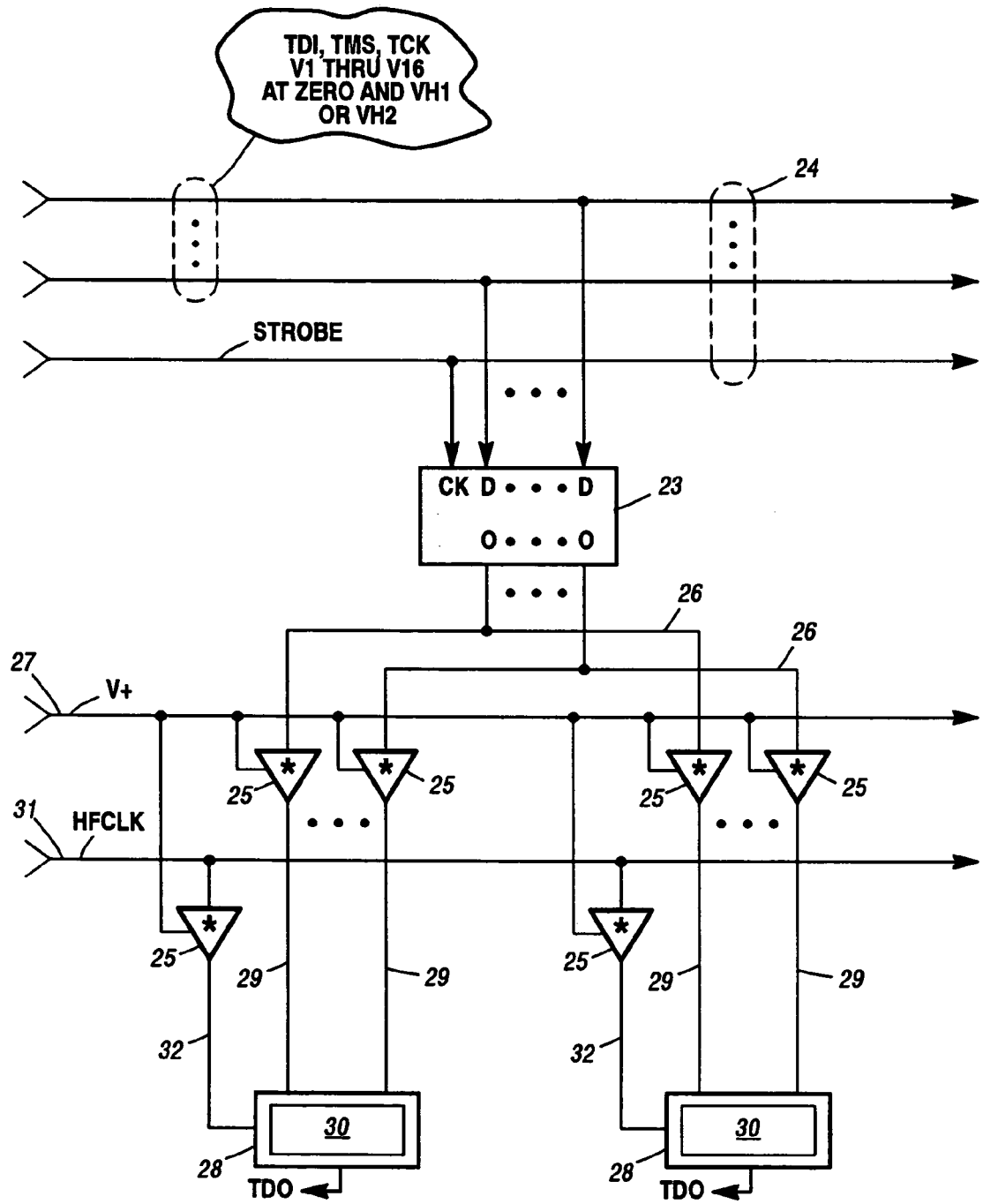
FIG. 10 shows still another modification that can be made to the chip holding module of FIG. 2.

With the modification of FIG. 10, all three of the advantages that were previously described in conjunction with module 20 of FIG. 2 are still obtained. For example, a defective IC-chip 30 in the left socket in FIG. 10 will not adversely effect the testing of another chip in the right socket in FIG. 10.

Also, the modification of FIG. 10 can be made in combination with any of the previously described modification. For example, to combine the modification of FIG. 8 with the modification of FIG. 10, one digital multiplexor 91 is added for the left socket in FIG. 10 and another digital multiplexor 91 is added for the right socket.

As yet another modification, the particular values of resistance and inductance that are given in TABLE 2, for each of the components in the signal translator 25 of FIG. 5, can be changed. However, one preferred limitation in that the resistors R1 and R2 remain large enough to keep the maximum power dissipation in the signal translator 25 to less than one-tenth of one watt. That maximum power dissipation is only 0.055 watts for the TABLE 2 values of the resistors R1 and R2, as was previously calculated by equations 1–5 of FIG. 6.

Also, a second preferred limitation in that the resistors R1 and R2 have substantially larger magnitudes, and smaller tolerances, than the ON-resistance through the current channel of transistor TR1. Due to this limitation, the output voltages from the signal translator 25 are insensitive to variances in the ON-resistance of transistor TR1.

For example, in equation 3 of FIG. 6, the ON-resistance of transistor TR1 is 4.5 ohms with a tolerance of 50%. Such a large tolerance is typical for a field effect transistor that is mass produced. By comparison, the tolerance for resistor R1 and resistor R1 preferably is only 1%.

Using the above values, the largest current through transistor TR1 is V+divided by the resistance of 4.5+121+55−(4.5)(50%)−(121+55)(1%). This minimum resistance equals 176.5 ohms.

By comparison, the smallest current through transistor TR1 is V+divided by the resistance of 4.5+121+55+(4.5)(50%)+(121+55)(1%). This maximum resistance equals 184.51 ohms.

The average value of the above two resistances is (176.5+184.5)÷2. This equals 180.5 ohms. This average value has a tolerance of (184.5−180.5)÷180.5. But, this tolerance is only 2.49%, whereas the tolerance of the ON-resistance for transistor TR1 is 50%.

As still another modification, the N-channel transistor TR1 in the signal translator 25 of FIG. 5 can be changed to a P-channel transistor. With this modification, the P-channel transistor turns ON when the voltage from conductor 26 is low; and, the transistor turns OFF when the voltage from conductor 26 is low. Thus with this modification, the signal translator 25 generates output signals on conductor 29 which are the translated inverse of the input signals that it receives on conductor 27.

Further, as another modification, the total number of sockets 28 in module 20 of FIG. 2 can be any number that will fit on the circuit board 21. Similarly, the total number of signal translators 23 per socket can be any number that is required by the IC-chip which is being tested. Typically, the total number of signal translators 23 on module 20 will be at least fifty.

Also, as another modification, the IC-chips 30 which are held in the sockets 28 can be either packaged or unpackaged, as desired. An unpackaged IC-chip is an integrated circuit by itself. A packaged IC-chip can be 1) an integrated circuit which is mounted on a substrate that has input/output terminals, or 2) an integrated circuit which is completely enclosed in a protective container that has input/output terminals. Thus, the term "IC-chip" as used herein means all of the above items.

Several modifications to module 20 of FIG. 2, and several modifications to the signal translator 25 of FIG. 5, have now been described in detail. Accordingly, it should be understood that the present invention is not limited to the details of just the illustrated preferred embodiments of FIGS. 2 and 5, but is defined by the appended claims.

What is claimed is:

1. A circuit, for use in testing an IC-module; said circuit comprising:
a single transistor having a current channel which is coupled in series with a first resistor between a source voltage terminal and an output terminal;
said single transistor also having a control lead, for enabling and disabling the flow of current through said current channel, which receives an input test signal;
a second resistor which couples said output terminal to a reference voltage terminal; and,
a socket which is structured to hold said IC-module, having a test signal input terminal that is coupled to said output terminal.

2. A circuit according to claim 1 wherein said first and second resistors have magnitudes which limit the square of said current through said current channel, times said first and second resistors, to be less than one-tenth of one watt.

3. A circuit according to claim 1 wherein said first resistor is connected directly to said source voltage terminal, and said current channel of said single transistor is connected directly to said output terminal.

4. A circuit according to claim 1 wherein said current channel of said single transistor is connected directly to said source voltage terminal, and said first resistor is connected directly to said output terminal.

5. A circuit according to claim 1 wherein said single transistor has a resistance through said current channel when said current is enabled which has a large tolerance, and said first and second resistors are substantially larger in resistance and have a small tolerance.

6. A circuit according to claim 1 which further includes a variable voltage source which has an output that is coupled to said source voltage terminal.

7. A circuit according to claim 1 wherein the only coupling between said output terminal and said second resistor is a conductor.

8. A circuit according to claim 1 wherein the only coupling between said output terminal and said second resistor is a conductor in a series with an inductive filter.

9. A circuit according to claim 1 wherein the only coupling between said output terminal and said test signal input terminal on said socket is a conductor and an input to one digital multiplexor.

10. A circuit according to claim 1 wherein the only coupling between said output-terminal and said test signal input terminal on said socket is a conductor and an input to one analog multiplexor.

11. A circuit according to claim 1 wherein said single transistor is an N-channel field effect transistor.

12. A circuit according to claim 1 wherein said single transistor is a P-channel field effect transistor.

* * * * *